United States Patent
Cheng et al.

(10) Patent No.: US 9,171,759 B2
(45) Date of Patent: Oct. 27, 2015

(54) SYSTEM AND METHOD FOR DIE TO DIE STRESS IMPROVEMENT

(71) Applicant: Taiwan Semiconductor Manufacturing Co., Ltd., Hsin-Chu (TW)

(72) Inventors: Chia-Pin Cheng, Kaohsiung (TW); Jung-Liang Chien, Sinying (TW); Chih-Kang Chao, Tainan (TW); Chi-Cherng Jeng, Madou Township (TW); Hsin-Chi Chen, Tainan (TW); Ying-Lang Wang, Lung-Jing (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/717,883

(22) Filed: Dec. 18, 2012

(65) Prior Publication Data

US 2014/0167199 A1   Jun. 19, 2014

(51) Int. Cl.
*H01L 21/78* (2006.01)
*H01L 23/00* (2006.01)
*H01L 23/58* (2006.01)
*H01L 21/66* (2006.01)

(52) U.S. Cl.
CPC ............ *H01L 21/78* (2013.01); *H01L 23/562* (2013.01); *H01L 23/585* (2013.01); *H01L 22/32* (2013.01); *H01L 2924/0002* (2013.01); *H01L 2924/10253* (2013.01); *H01L 2924/10329* (2013.01)

(58) Field of Classification Search
None
See application file for complete search history.

(56) References Cited

U.S. PATENT DOCUMENTS

| | | | |
|---|---|---|---|
| 2005/0263855 A1 | 12/2005 | Fu et al. | |
| 2010/0025824 A1* | 2/2010 | Chen et al. | 257/620 |
| 2010/0090304 A1* | 4/2010 | Liu et al. | 257/432 |
| 2010/0252916 A1* | 10/2010 | Chen et al. | 257/620 |
| 2011/0115057 A1* | 5/2011 | Harn et al. | 257/620 |
| 2011/0127648 A1* | 6/2011 | Chen et al. | 257/620 |

FOREIGN PATENT DOCUMENTS

TW      200616019      5/2006

OTHER PUBLICATIONS

Official Action issued Aug. 31, 2015 in counterpart Taiwan patent application.

* cited by examiner

*Primary Examiner* — Steven Loke
*Assistant Examiner* — Juanita B Rhodes
(74) *Attorney, Agent, or Firm* — Duane Morris LLP

(57) ABSTRACT

A semiconductor wafer having a plurality of chip die areas arranged on a wafer in an array, each chip die area including a seal ring area with one or more first sets of polygonal structures. The wafer further comprises scribe line areas between the chip die areas, the scribe line areas including one or more second sets of polygonal structures. The presence of proximate polygonal structures between the scribe line and seal ring areas balance stresses between the chip die areas during wafer dicing operation.

17 Claims, 6 Drawing Sheets

SYSTEM AND METHOD FOR DIE TO DIE STRESS IMPROVEMENT

BACKGROUND

A semiconductor chip or die (e.g., an image sensor chip) is typically fabricated on a single semiconductor wafer along with hundreds, and in some cases thousands, of copies of the same die. Cutting is needed to separate individual dies from a semiconductor wafer. Such cutting is known as dicing or wafer dicing and is typically performed using a die saw. A common die saw used for dicing is a diamond saw. Conventionally, cuts are made along non-functional areas of semiconductor material, known as scribe lines, which separate the dies on the wafer from each other. Using a diamond saw introduces mechanical stress to the semiconductor wafer and can result in cracking at the die edges thereby compromising the integrity and reliability of integrated circuit (IC) devices present on the die. One alternative to using a diamond saw is laser scribing. Laser scribing involves scanning a laser beam over the scribe lines of a semiconductor wafer; however, laser scribing typically provides a low throughput and is expensive.

Typically, scribing or cutting is carried out on the active side of the semiconductor wafers where the IC devices are formed and the scribe lines are defined. Conventional scribe line areas do not have circuit elements of the die areas, and because each die is an independent device, metal features for interconnect wiring conductors are also confined to the die areas and do not extend into or across the scribe lines where the die saw will cut through the wiring layers. Some wafer-level reliability and functionality test pads, however, can be located in the scribe line areas to facilitate wafer-level testing. In such wafers, the scribing or cutting across the test pads generally results in severe dielectric peeling and cracking. These de-laminations become sources of defects that detrimentally affect the integrity and reliability of the diced chips.

Further, an increasing demand for image sensors having faster processing speeds and better image quality has led to smaller pixel cells sizes and smaller photosensitive regions or photodiodes. Advances in semiconductor technology including the use of low-k or extremely low-k (ELK) dielectric materials to reduce cross coupling and parasitic capacitance between metal layers are employed to match the pace of decreasing image sensor chip size. Such low-k and ELK dielectrics, however, are brittle due to their porous nature subsequently making image sensors with such materials prone to peeling and cracking when diamond saws are used to separate dies on a semiconductor wafer.

Another conventional method of increasing the size of a photodiode in a pixel cell is to use a backside illuminated ("BSI") image sensor. BSI image sensors typically include a pixel array fabricated on the frontside of the semiconductor wafer, but receive light through a back surface of the image sensor. During fabrication of a BSI image sensor, the image sensor chip or device is first fabricated on a semiconductor wafer, and when the necessary elements have been formed in or on the wafer, the device wafer is bonded to a carrier wafer for further processing. Due to the tradeoff of parameters such as bonding strength and wafer distortion, bonding strength can be maximized, but this can cause weakness at the bonding interface. This combination of low-k or ELK dielectrics in the device wafer and weak bonding interface can increase the occurrence of peeling and cracking when a diamond saw is used to dice BSI dies from the combined wafer. Thus, there is a need for improved scribe line structures in the semiconductor industry.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features can be arbitrarily increased or reduced for clarity of discussion.

DETAILED DESCRIPTION

Figure 1:
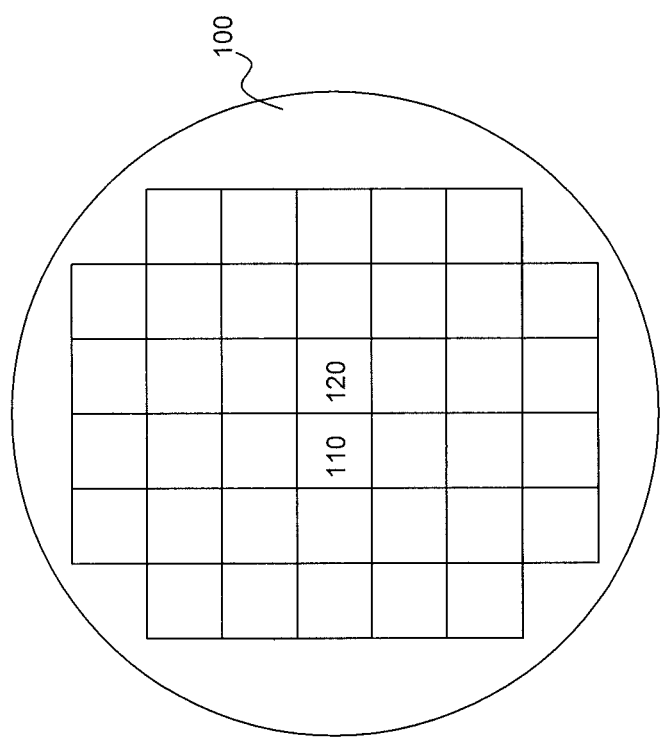
FIG. 1 is a plan view of a wafer including a number of individual dies.

It is understood that the following disclosure provides many different embodiments or examples for implementing different features of various embodiments. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. Moreover, space orientation terms such as "under", "on", "up", "down", etc. are used to describe a relationship between a device or a characteristic and another device or another characteristic in the drawing. It should be noted that the space orientation term can cover different orientations of the device besides the orientation of the device illustrated in the drawing. For example, if the device in the drawing is turned over, the device located "under" or "below" the other devices or characteristics is reoriented to be located "above" the other devices or characteristics. Therefore, the space orientation term "under" may include two orientations of "above" and "below". Additionally, the terms "wafer", "chip" and "die" are used interchangeably in this disclosure and such use should not limit the scope of the claims appended herewith.

The present disclosure is generally directed to providing dummy patterns or structures to balance or reduce stress, cracking and other deleterious effects from exemplary color image sensor (CIS) scribe line etching, cutting or laser scribing processes.

Figure 2:
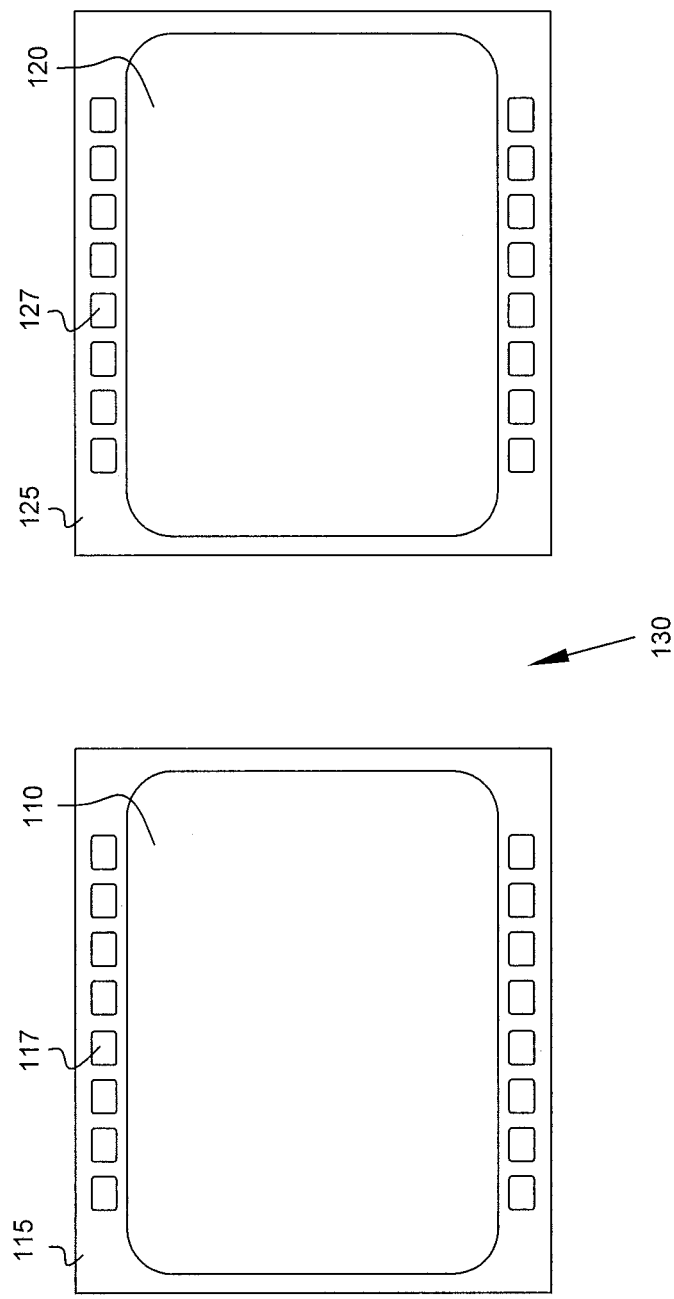
FIG. 2 is a plan view of the wafer of FIG. 1 in greater detail.

FIG. 1 is a plan view of a wafer 100 including a number of individual dies 110, 120. The terms "die" and "dies" are used as generic terms referring to a device formed in or on a wafer 100. One or more individual dies on the wafer 100 can be, but are not limited to, a complementary metal oxide semiconductor (CMOS) image sensor or CIS. For example, dies formed on the wafer 100 can also be one or more other kinds of electronic, optical, or mixed electronic/optical devices such as frontside-illuminated (FSI) or backside-illuminated (BSI) image sensors. The semiconductor wafer 100 can be composed of silicon, gallium arsenide or other suitable semiconductor materials. FIG. 2 is a plan view of the wafer of FIG. 1 in greater detail. With reference to FIG. 2, the dies 110, 120 are formed on the semiconductor wafer 100 such that there are non-functional wafer spaces 130 between the dies 110, 120. Each of the dies 110, 120 can include a sealing ring structure or region 115, 125 that protects the circuitry area of the dies 110, 120 from damage such as dicing saw induced cracks and stresses. The sealing ring structure 115, 125 can also include regions for test pads 117, 127 and other structures. Typically, individual dies 110, 120 are formed on the wafer 100 such that the non-functional spaces 130 together form lines that separate all the individual dies formed on the wafer 100. These non-functional spaces or areas 130 of the wafer 100 are generally known as scribe lines. Along these scribe lines the individual dies 110, 120 are cut from the wafer 100 using scribe line etching, die saw cutting, laser scribing, or other die separation processes. During such die separation processes, mechanical stresses can be induced on the semiconductor wafer 100 and can result in cracking and/or peeling at the die edges thereby compromising the integrity and reliability of IC devices present on the respective die. Additionally, residual stresses due to differences in the coefficient of thermal expansion (CTE) and tensile modulus (i.e., Young's modulus) between adjacent semiconductor layers of the individual dies 110, 120 can result in delamination and peeling of the respective dies during die separation processes.

Figure 3:
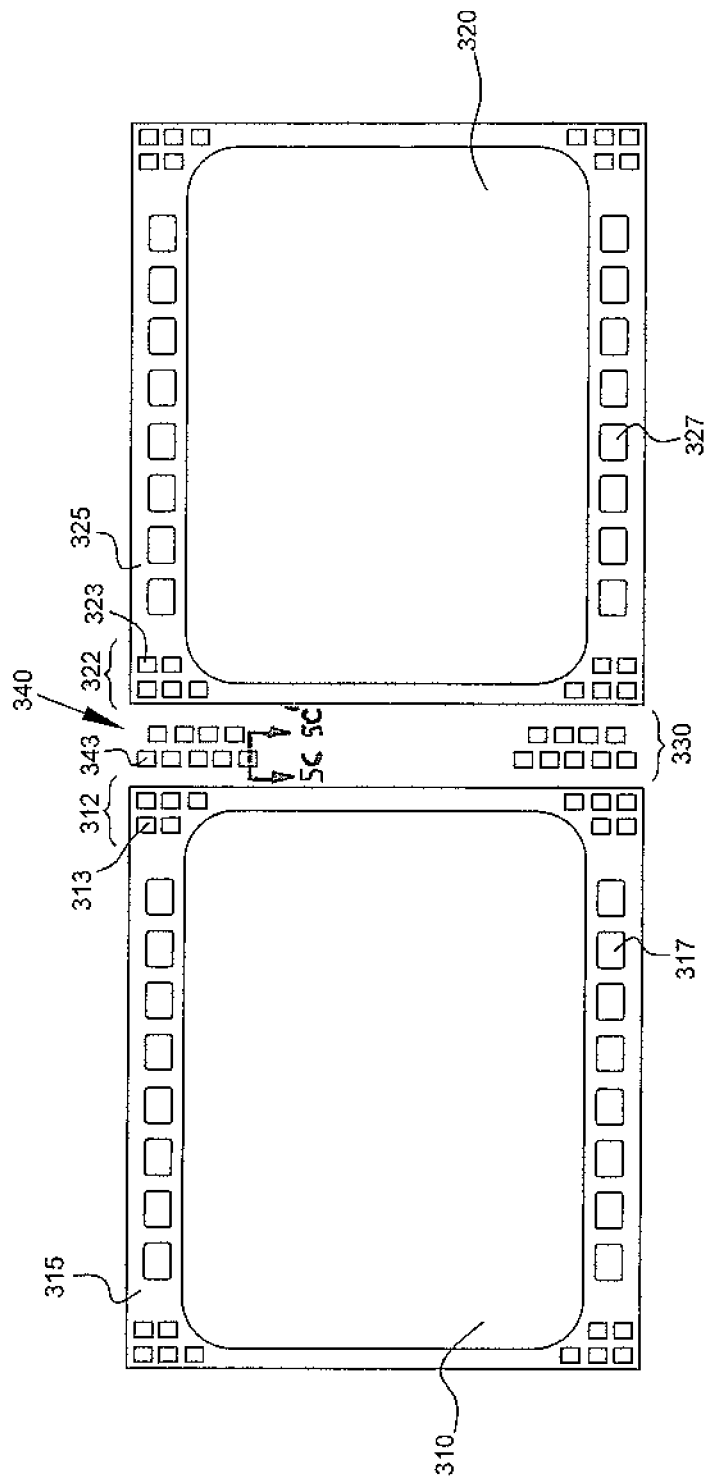
FIG. 3 is a plan view of the wafer of FIG. 1 in greater detail having scribe lines with dummy patterns or structures between dies according to an embodiment of the present disclosure.
Figure 4:
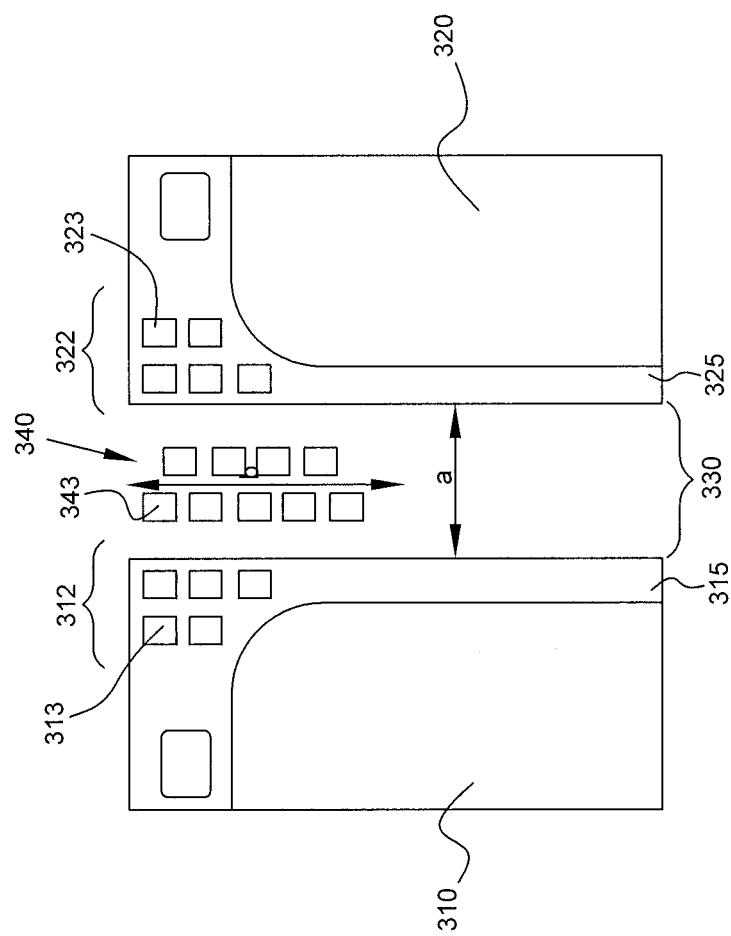
FIG. 4 is a plan view of the dies of FIG. 3 in greater detail.

FIG. 3 is a plan view of the wafer of FIG. 1 in greater detail having scribe lines with dummy patterns or structures between dies according to various embodiments of the present disclosure. FIG. 4 is a plan view of the dies of FIG. 3 in greater detail. With reference to FIGS. 3 and 4, dies 310, 320 are formed on a semiconductor wafer such that there are non-functional wafer spaces or scribe lines 330 between the dies 310, 320. In some embodiments of the present disclosure, the width "a" of the scribe line 330 is approximately 80 μm. Of course, such a dimension is exemplary only and should not limit the scope of the claims appended herewith as exemplary scribe lines can have various widths. For example, the width of the scribe lines can be between 30 to 80 μm or greater than 80 μm. Each of the dies 310, 320 can include a sealing ring structure or region 315, 325 that protects the circuitry area of the dies 310, 320 from damage such as dicing saw induced cracks and stresses. The sealing ring structure 315, 325 also includes regions for test pads 317, 327 and other structures. In some embodiments of the present disclosure, the dimensions of the sealing ring structure 315, 325 is dependent upon the size of the test pad(s) 317, 327, number of test pads, die size, etc.

The scribe lines 330 together form an area that separates all the individual dies formed on a wafer. In the scribe lines 330, one or more dummy patterns 340 having one or more structures 343 can be formed between the dies 310, 320 to compensate for mechanical or other stresses during die separation processes. In various embodiments of the present disclosure the length or distance "b" of the dummy patterns 340 in the scribe line 330 is approximately 300 μm. Of course, such a dimension is exemplary only and should not limit the scope of the claims appended herewith as exemplary patterns and associated structures can have varying distances or dimensions. For example, in various embodiments of the present disclosure the structures 343 and respective pattern 340 can extend the full length of the scribe lines 330 so that the structures 343 occupy substantially all the scribe line 330 in one continuous film. As depicted, the dummy pattern 340 includes two sets or arrays of structures, each array having nine square structures 343. One array of structures positioned between two adjacent corners of the dies 310, 320 and a second array of structures positioned at opposing corners of the dies 310, 32. It should be noted that this depicted geometry of structures is exemplary only and should not limit the scope of the claims appended herewith as any number or geometry of structures can be included in exemplary dummy patterns according to various embodiments of the present disclosure. For example, the dummy pattern 340 can be symmetrical or asymmetrical, and the structure(s) 343 can be in the shape of a pentagon, hexagon, rectangle, or other suitable polygon and combinations thereof.

In some embodiments of the present disclosure, additional dummy patterns 312, 322 having one or more structures 313, 323 can be formed on each die or chip 310, 320, respectively, to balance mechanical or other stresses during die separation processes. In one embodiment of the present disclosure, these dummy patterns 312, 322 can be formed on the sealing ring structure or area 315, 325 of the respective dies. As depicted, the dummy patterns 312, 322 include a set or array of structures 313, 323 on a corner of a respective die 310, 320, the array having five square structures 313, 323. Similar or different arrays can be positioned at each corner of the respective dies. It should be noted that this depicted geometry of structures is exemplary only and should not limit the scope of the claims appended herewith as any number or geometry of structures can be included in the dummy patterns 312, 322 according to various embodiments of the present disclosure. For example, any of the dummy patterns 312, 322 can be symmetrical or asymmetrical, and the structure(s) 313, 323 can be in the shape of a pentagon, hexagon, rectangle, or other suitable polygon and combinations thereof. Further the number of structures 313, 323 in a specific array can be more, less or equal to the number of structures 343 in a corresponding or adjacent dummy pattern 340 in the scribe line 330. Additionally, the structures 313, 323 in the dies 310, 320 can extend the length of the die 310, 320 within the respective sealing ring structures 315, 325. The provision of the structures 313, 323, 343 in the corner regions of the dies 310, 320 and scribe lines 330, as applicable, can thus minimize or eliminate delamination at interfaces of dielectric materials in the layers of the wafer and can reduce or balance residual and mechanical stresses in the die.

Along the scribe lines 330 of a wafer, the individual dies 310, 320 are cut from the wafer using die separation processes, however, embodiments of the present disclosure employing exemplary dummy patterns or structures in the scribe lines and/or dies can reduce or balance mechanical, residual and other stresses induced on the semiconductor wafer thereby increasing the integrity and reliability of IC devices present on the respective die. Additionally, it has been discovered that embodiments of the present disclosure employing exemplary dummy patterns or structures in the scribe lines and/or dies improve the photo response non-uniformity (PRNU) and dark image non-uniformity (DINU)

or dark signal non-uniformity (DRNU) of imaging sensors through such a reduction in or balancing of mechanical, residual and other stresses induced on a semiconductor wafer. As is known in the industry, PRNU and DINU are generally sources of fixed pattern noise in a digital imaging sensor seen as a variation in pixel responsivity over a charge coupled device or other device.

Figure 5A:
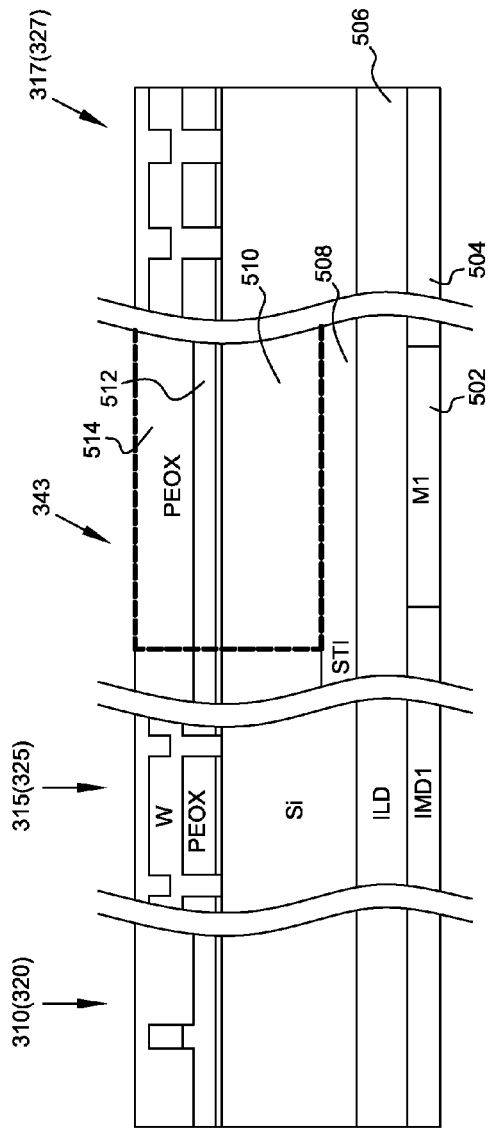
FIG. 5A is a cross-sectional view of the scribe line of FIG. 3.
Figure 5B:
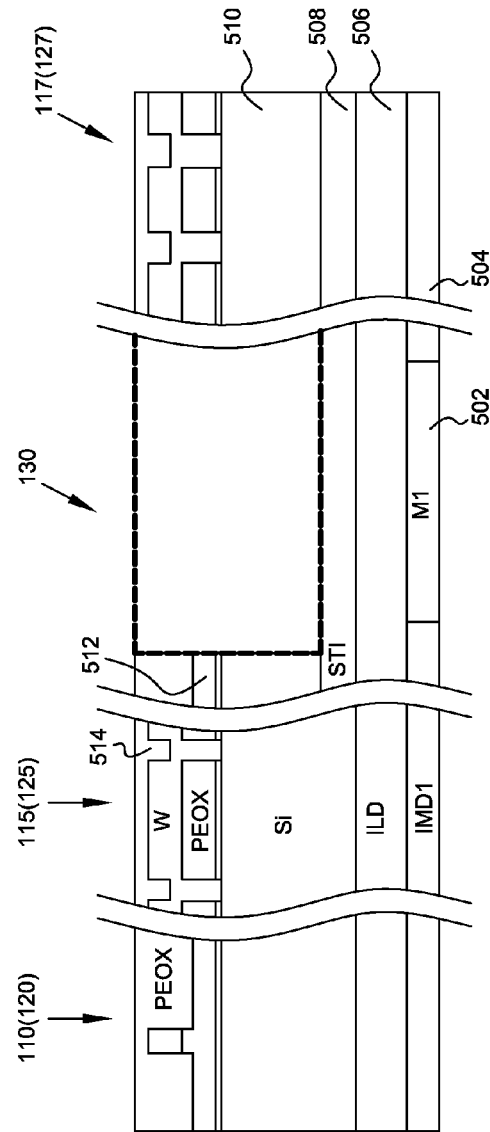
FIG. 5B is a cross-sectional view of the scribe line of FIG. 2.
Figure 5C:
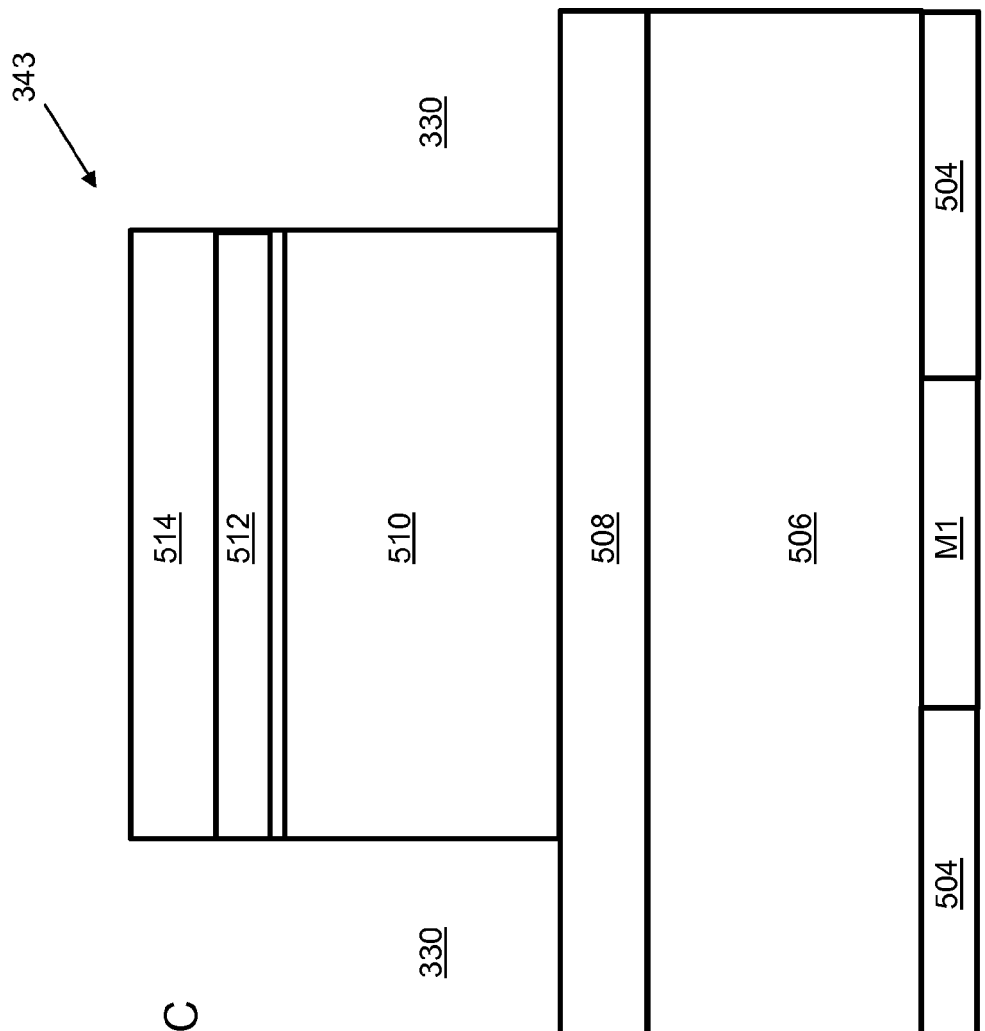
FIG. 5C is a cross-sectional view of a polygonal structure taken along section line 5C-5C' of FIG. 3.

FIG. 5A is a cross-sectional view of the scribe line and other areas of the dies in FIG. 3. FIG. 5C is a cross sectional view of one of the structures 343 taken along section line 5C-5C' in FIG. 3. FIG. 5B is a cross-sectional view of the scribe line and other areas of the dies in FIG. 2. With reference to FIG. 5A, one embodiment of the present disclosure is illustrated showing a cross section of a structure 343 in the scribe line 330 between the dies 310, 320 depicted in FIGS. 3 and 4. An exemplary structure 343 can include a metallization (M1) 502 within an intermetal dielectric layer 504 or other suitable insulation layer. The intermetal dielectric layer 504 can comprise undoped silicate (USG), fluorine-doped silica glass (FSG), silicon nitride (SIN), or another suitable insulative material. An interlayer dielectric 506 can be deposited on the intermetal dielectric layer 504 and can be comprised of the same or different insulative material as the intermetal dielectric layer 504. These dielectric layers can be formed using conventional deposition techniques including, but not limited to, chemical vapor deposition (CVD), plasma enhanced chemical vapor deposition (PECVD), and other suitable techniques. The M1 layer 504 can be any suitable intermetal dielectric layer and can comprise a plurality of metal lines 502 and rows of landing pads. The M1 layer 504 can be formed using any suitable deposition or sputtering technique. Overlying the interlayer dielectric 506 is a shallow trench isolation (STI) layer 508 with a silicon layer 510 deposited thereon. The STI layer 508 can be formed using conventional etching techniques. An exemplary, non-limiting STI layer 508 includes one or more dielectric materials such as, but not limited to, silicon dioxide. A first plasma enhanced oxide (PEOX) layer 512 can be deposited on the silicon layer 510 with a second PEOX 514 deposited thereon. These PEOX layers can be formed using conventional deposition techniques including, but not limited to, PECVD and other suitable techniques.

With continued reference to FIG. 5A, adjacent structures depicted in FIGS. 3 and 4 such as the sealing ring structure 315 (325), die 310 (320), and test pads 317 (327) include similar layers. Of course, these structures can also include other layers or structures, such as through silicon vias (TSVs), metallic contacts such as tungsten contacts, etc., and the depiction illustrated in FIG. 5A should not limit the scope of the claims appended herewith. FIG. 5B illustrates a cross section of the scribe line 130 between the dies 110, 120 depicted in FIG. 2. Cross-sections of similar adjacent structures, e.g., sealing ring structures 115 (125), dies 110 (120), and test pads 117 (127) are also illustrated. Comparing FIGS. 5A and 5B, it is readily seen that the area of the scribe line 130 of FIG. 5B is open thereby resulting in unbalanced mechanical stresses induced on the semiconductor wafer 100 during die separation process that can lead to cracking and/or peeling at the die edges and to other mechanical stresses in the respective dies. Furthermore, unbalanced residual stresses due to differences in the CTE and tensile modulus between adjacent semiconductor layers of the individual dies 110, 120 in FIG. 5B can result in delamination and peeling of the respective dies during die separation processes.

An exemplary process for separating or dicing dies (e.g., image sensor dies) from a semiconductor wafer can include etching and/or sawing the wafer utilizing the structures described above. Upon fabrication of image sensor dies, optical and electronic components of an image sensor can be formed in or on the backside and frontside of the dies, as appropriate. For example, color filters, microlens arrays, etc. can be formed on the backside of the respective dies while metal stacks and other structures or layers can be formed on the frontside of the dies. A mask can then be formed on the backside of the wafer but with openings exposing the backside in areas that are substantially in alignment with the scribe lines 330 depicted in FIGS. 3 and 4. In some embodiments of the present disclosure, the mask is formed by depositing a layer of photoresist on the backside of the wafer and photolithographically patterning and etching the photoresist to expose the parts of backside that are substantially aligned with the scribe lines 330 and areas in the scribe lines without structures as described above. Etching can thus be used to remove semiconductor materials not masked by the mask. Exemplary etching techniques include, but are not limited to, dry reactive etching, wet etching, etc. Etching can be stopped at any layer during the process and a die saw or other die separation process employed to complete the separation or dicing of the respective dies. By using etching alone or in combination with other die separation processes, the occurrence of peeling and cracking of the dies due to mechanical and residual stresses can further be reduced or eliminated.

In some embodiments of the present disclosure a semiconductor wafer is provided having a plurality of chip die areas arranged on a wafer in an array, scribe line areas between the chip die areas, and a first set of polygonal structures provided in one or more of the scribe line areas. In one embodiment, the width of the scribe line areas is approximately 80 µm. The presence of these structures in the scribe line areas can balance stresses between the chip die areas during wafer dicing operation. In another embodiment, the first set of polygonal structures is positioned in a region between corners of adjacent chip die areas. This first set of polygonal structures can extend the full length of one or more scribe line areas so as to occupy a portion of the respective scribe line area in one continuous film. In another embodiment, the length of the first set of polygonal structures is approximately 300 µm. These polygonal structures can be any type of geometry including, but not limited to, squares, rectangles, hexagons, pentagons, circles, and combinations thereof. Further, the polygonal structures can comprise one or more semiconductor layers having a composition similar to semiconductor layers in proximate chip die areas. In additional embodiments of the present disclosure, each of the chip die areas can include a seal ring area having a second set of polygonal structures. In such embodiments, the first and second sets of polygonal structures can act together to balance stresses between the chip die areas during wafer dicing operation. Further, the geometry or geometric relationship of the polygonal structures in the first and second sets can be substantially the same (e.g., shapes of individual structures, pattern arrangements, positioning in respective areas and in relation to the other sets of structures, etc.).

In other embodiments of the present disclosure a semiconductor wafer is provided having a plurality of chip die areas arranged on a wafer in an array. Each chip die area can include a seal ring area with one or more first sets of polygonal structures. The wafer further includes scribe line areas between the chip die areas, the scribe line areas including one or more second sets of polygonal structures. The presence of proximate polygonal structures between the scribe line and seal ring areas can act to balance stresses between the chip die areas during wafer dicing operation. In one embodiment, the one or more first sets of polygonal structures are positioned in corner regions of respective chip die areas. In another embodiment, the one or more second sets of polygonal structures are positioned in a region between corners of adjacent chip die areas. The one or more second sets of polygonal structures can extend the full length of respective scribe line areas so as to occupy a portion of the respective scribe line area in one continuous film. Further, the polygonal structures in the first and second sets can be any type of geometry including, but not limited to, squares, rectangles, hexagons, pentagons, circles, and combinations thereof. In another embodiment of the present disclosure, polygonal structures in the first set which are proximate to polygonal structures in the second set have substantially the same geometry or geometric relationship (e.g., shapes of individual structures, pattern arrangements, positioning in respective areas and in relation to the other sets of structures, etc.). In one embodiment, the second set of polygonal structures includes one or more semiconductor layers having a composition similar to semiconductor layers in proximate chip die areas.

In various embodiments of the present disclosure, a semiconductor wafer is provided having a plurality of chip die areas arranged on a wafer with each chip die area including a seal ring area having one or more first patterns of dummy structures. The wafer further includes a plurality of scribe line areas between the chip die areas, the scribe line areas including one or more second patterns of dummy structures where the presence of proximate first and second patterns balance stresses between the chip die areas during wafer dicing operation. In one embodiment, the dummy structures in the second pattern have one or more semiconductor layers with a composition similar to semiconductor layers in proximate chip die areas. In another embodiment, the dummy structures in the first and second patterns are non-functional. In a further embodiment, the one or more first patterns of dummy structures are positioned in corner regions of respective seal ring areas and the one or more second patterns of dummy structures are positioned in a region between corners of adjacent chip die areas.

It can be emphasized that the above-described embodiments, particularly any "preferred" embodiments, are merely possible examples of implementations, merely set forth for a clear understanding of the principles of the disclosure. Many variations and modifications can be made to the above-described embodiments of the disclosure without departing substantially from the spirit and principles of the disclosure. All such modifications and variations are intended to be included herein within the scope of this disclosure and the present disclosure and protected by the following claims.

Further, the foregoing has outlined features of several embodiments so that those skilled in the art can better understand the detailed description that follows. Those skilled in the art should appreciate that they can readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they can make various changes, substitutions and alterations herein without departing from the spirit and scope of the present disclosure.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous.

As shown by the various configurations and embodiments illustrated in FIGS. 1-5B, a system and method for die to die stress improvement have been described.

While preferred embodiments of the present subject matter have been described, it is to be understood that the embodiments described are illustrative only and that the scope of the invention is to be defined solely by the appended claims when accorded a full range of equivalence, many variations and modifications naturally occurring to those of skill in the art from a perusal hereof.

We claim:

1. A semiconductor wafer comprising a semiconductor material:
   the wafer having a plurality of die areas arranged in an array, the wafer having an inter-layer dielectric (ILD) material adjacent the die areas and a metal line layer adjacent the ILD material, the metal line layer being on a front side of the wafer;
   the wafer having scribe line areas comprising spaces between the die areas, at a back side of the wafer opposite the front side; and
   the wafer having a first set of polygonal structures in one or more of the scribe line areas, each polygonal structure in the first set of polygonal structures comprising a portion of the semiconductor material and a dielectric layer adjacent the portion of the semiconductor material, wherein the semiconductor material occupies an entire area of each polygonal structure in the first set of polygonal structures, and each polygonal structure in the first set of polygonal structures, and each polygonal structure is adjacent to and laterally surrounded by a space of one of the scribe line areas.

2. The semiconductor wafer of claim 1 wherein the first set of polygonal structures is positioned in a region between corners of adjacent die areas.

3. The semiconductor wafer of claim 1 wherein the first set of polygonal structures extend the full length of one or more scribe line areas.

4. The semiconductor wafer of claim 1 wherein the polygonal structures in the first set of polygonal structures are selected from the group consisting of squares, rectangles, hexagons, pentagons, circles, and combinations thereof.

5. The semiconductor wafer of claim 1 wherein each of the die areas include a seal ring area, and
   wherein the seal ring areas comprise a second set of polygonal structures, whereby the first and second sets of polygonal structures balance stresses between the die areas during a wafer dicing operation.

6. The semiconductor wafer of claim 5 wherein a geometry of each of the polygonal structures in the to first and second sets of polygonal structures are substantially the same.

7. A semiconductor wafer comprising a semiconductor material: the wafer having a plurality of die areas arranged in an array, the wafer having a metal line layer on a front side of the wafer, the metal line layer being adjacent an inter-layer dielectric (ILD) material; a portion of the ILD layer being in the die area; and
   a seal ring area with one or more first sets of polygonal structures; and the wafer having scribe line areas between the die areas, on a back side of the wafer opposite the front side, the scribe line areas including one or more second sets of polygonal structures, each polygonal structure in the one or more second sets of polygonal structures comprising a portion of the semiconductor material and a dielectric layer adjacent the portion of the semiconductor material, wherein the semiconductor material occupies an entire area of each polygonal structure in the one or more second sets of polygonal structures, and each polygonal structure in the one or more second sets of polygonal structures is adjacent to and laterally surrounded by a space of one of the scribe line areas.

8. The semiconductor wafer of claim 7 wherein the one or more first sets of polygonal structures are positioned in corner regions of respective die areas.

9. The semiconductor wafer of claim 7 wherein the one or more second sets of polygonal structures are positioned in a region between corners of adjacent die areas.

10. The semiconductor wafer of claim 7 wherein the one or more second sets of polygonal structures extend the full length of respective scribe line areas.

11. The semiconductor wafer of claim 7 wherein the polygonal structures in the one or more of first and second sets of polygonal structures are selected from the group consisting of squares, rectangles, hexagons, pentagons, circles, and combinations thereof.

12. The semiconductor wafer of claim 7 wherein polygonal structures in the one or more first sets of polygonal structures which are proximate to polygonal structures in the one or more second sets of polygonal structures have substantially the same geometry.

13. A semiconductor wafer comprising a semiconductor material:
the wafer having a plurality of die areas, having an interlayer dielectric (ILD) material adjacent the die areas and a metal line layer adjacent the ILD material, the metal line layer being on a front side of the wafer, each die area including a seal ring area with one or more first patterns of dummy structures; and
the wafer having a plurality of scribe line areas comprising spaces on a back side of the wafer opposite the front side, between the die areas, the scribe line areas including one or more second patterns of dummy structures, each dummy structure in the one or more second patterns of dummy structures comprising a portion of the semiconductor material and a dielectric layer adjacent the portion of the semiconductor material, wherein the semiconductor material occupies an entire area of each dummy structure in the one or more second patterns of dummy structures, and each dummy structure in the one or more second patterns of dummy structures is adjacent to and laterally surrounded by a space of one of the scribe line areas.

14. The semiconductor wafer of claim 13 wherein the one or more first patterns of dummy structures are positioned in corner regions of respective seal ring areas and the one or more second patterns of dummy structures are positioned in a region between corners of adjacent die areas.

15. The semiconductor wafer of claim 1, wherein a surface of the portion of semiconductor material in each polygonal structure in the first set of polygonal structures is coplanar with the back side of the semiconductor material of the wafer.

16. The semiconductor wafer of claim 7, wherein a surface of the portion of semiconductor material in each polygonal structure in the one or more second sets of polygonal structures is coplanar with the back side of the semiconductor material of the wafer.

17. The semiconductor wafer of claim 13, wherein a surface of the portion semiconductor material in each dummy structure in the one or more second patterns of dummy structures is coplanar with the back side of the semiconductor material of the wafer.

\* \* \* \* \*

UNITED STATES PATENT AND TRADEMARK OFFICE
CERTIFICATE OF CORRECTION

PATENT NO. : 9,171,759 B2
APPLICATION NO. : 13/717883
DATED : October 27, 2015
INVENTOR(S) : Cheng et al.

Page 1 of 1

It is certified that error appears in the above-identified patent and that said Letters Patent is hereby corrected as shown below:

IN THE CLAIMS:

Claim 6, Column 8, Line 53, delete "to"

Signed and Sealed this
Twenty-first Day of June, 2016

Michelle K. Lee
*Director of the United States Patent and Trademark Office*